US009356233B2

(12) United States Patent
Kozlova et al.

(10) Patent No.: US 9,356,233 B2
(45) Date of Patent: May 31, 2016

(54) MEMRISTOR WITH NANOBRIDGE STRUCTURE

(71) Applicant: Technische Universiteit Delft, Delft (NL)

(72) Inventors: Tatiana Kozlova, Delft (NL); Maria Rudneva, Delft (NL); Hendrik Willem Zandbergen, Delft (NL)

(73) Assignee: TECHNISCHE UNIVERSITEIT DELFT, Delft (NL)

( * ) Notice: Subject to any disclaimer, the term of this patent is extended or adjusted under 35 U.S.C. 154(b) by 0 days.

(21) Appl. No.: 14/290,272

(22) Filed: May 29, 2014

(65) Prior Publication Data

US 2014/0353570 A1 Dec. 4, 2014

(30) Foreign Application Priority Data

May 29, 2013 (NL) ...................................... 2010887

(51) Int. Cl.
*H01L 45/00* (2006.01)
*G11C 13/00* (2006.01)
*G11C 11/56* (2006.01)

(52) U.S. Cl.
CPC ............ *H01L 45/1226* (2013.01); *G11C 11/56* (2013.01); *G11C 11/5685* (2013.01); *G11C 13/0002* (2013.01); *G11C 13/0007* (2013.01); *G11C 13/0069* (2013.01); *H01L 45/085* (2013.01); *H01L 45/1253* (2013.01); *H01L 45/14* (2013.01); *H01L 45/1675* (2013.01)

(58) Field of Classification Search
None
See application file for complete search history.

(56) References Cited

U.S. PATENT DOCUMENTS

| | | | |
|---|---|---|---|
| 2005/0062033 A1* | 3/2005 | Ichihara et al. | 257/17 |
| 2008/0054283 A1* | 3/2008 | Min et al. | 257/98 |
| 2009/0236588 A1* | 9/2009 | Sharma et al. | 257/24 |
| 2010/0096071 A1* | 4/2010 | Lee et al. | 156/150 |
| 2011/0204310 A1 | 8/2011 | Strachan et al. | |
| 2011/0274882 A1* | 11/2011 | Wallace et al. | 428/166 |

OTHER PUBLICATIONS

Barmak, K. et al., "On the use of alloying elements for Cu interconnect applications", J. Vac. Sci. Technol. B vol. 24, No. 6, 2006, 2485-2498.
Gao, B. et al., "In situ transmission electron microscopy imaging of grain growth in a platinum nanobridge induced by electric current annealing", Nanotechnology vol. 22, No. 20, 2011, 205705-1-205705-5.
Kozlova, Tatiana et al., "In situ TEM and STEM studies of reversible electronmigration in thin palladium-platinum bridges", Nanotechnology vol. 24, No. 50, 2013, 505708-1-505708-7.

* cited by examiner

*Primary Examiner* — Daniel Luke
(74) *Attorney, Agent, or Firm* — Jeffrey D. Myers; Peacock Myers, P.C.

(57) ABSTRACT

A nanobridge or microbridge comprising a non-magnetic alloy of at least a first and second metal, the metals being selected from Group 8, 9, 10 and 11, wherein the first metal is present in a range of 50-95 wt. %, and memristors comprising one or more of same.

17 Claims, 4 Drawing Sheets

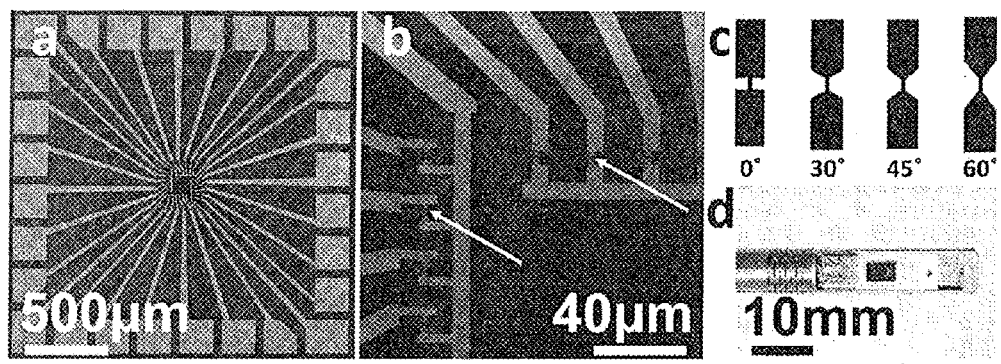
Fig. 1a-d
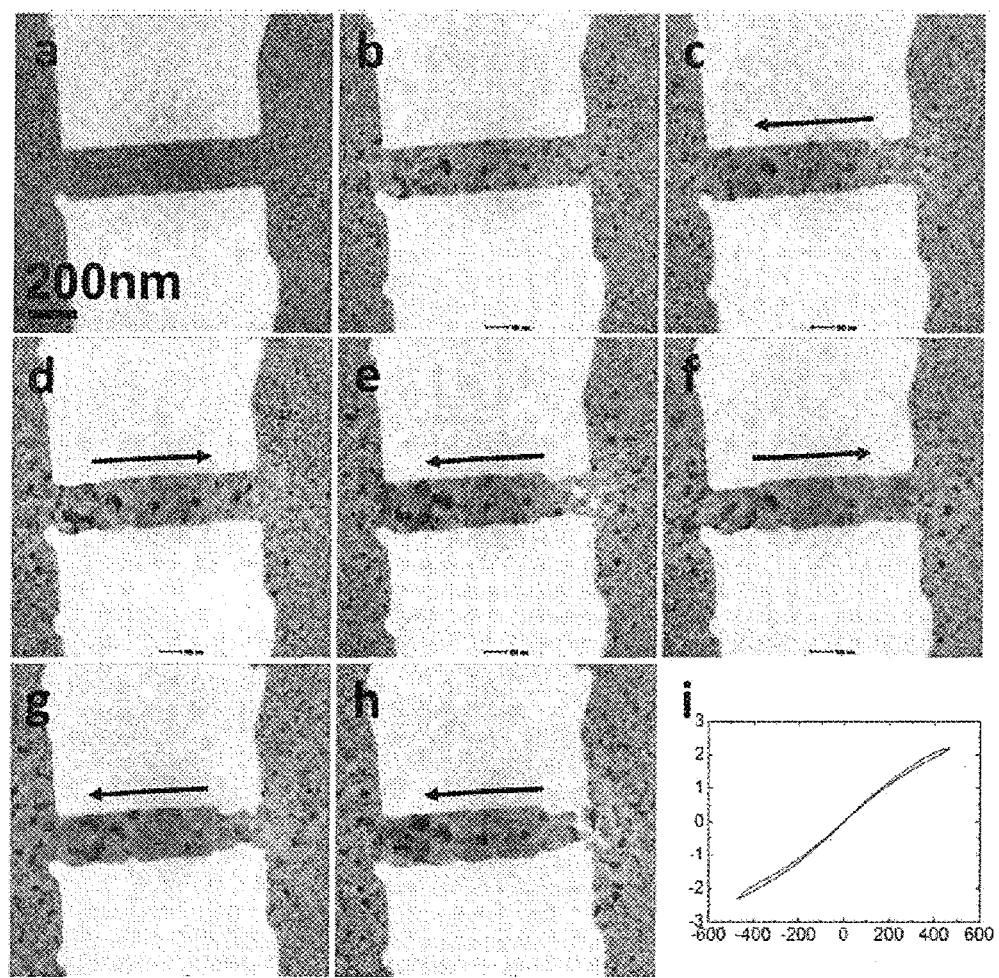
Fig. 2a-i

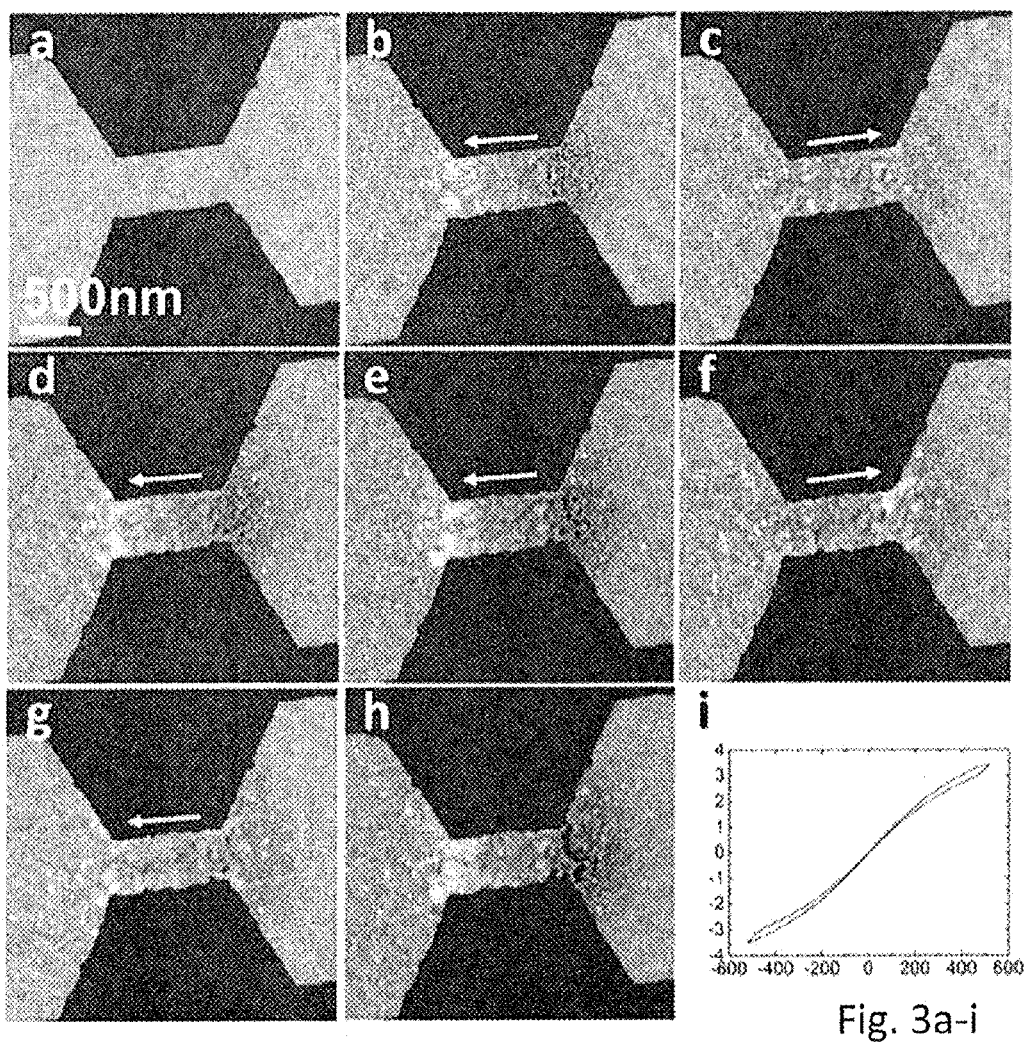
Fig. 3a-i

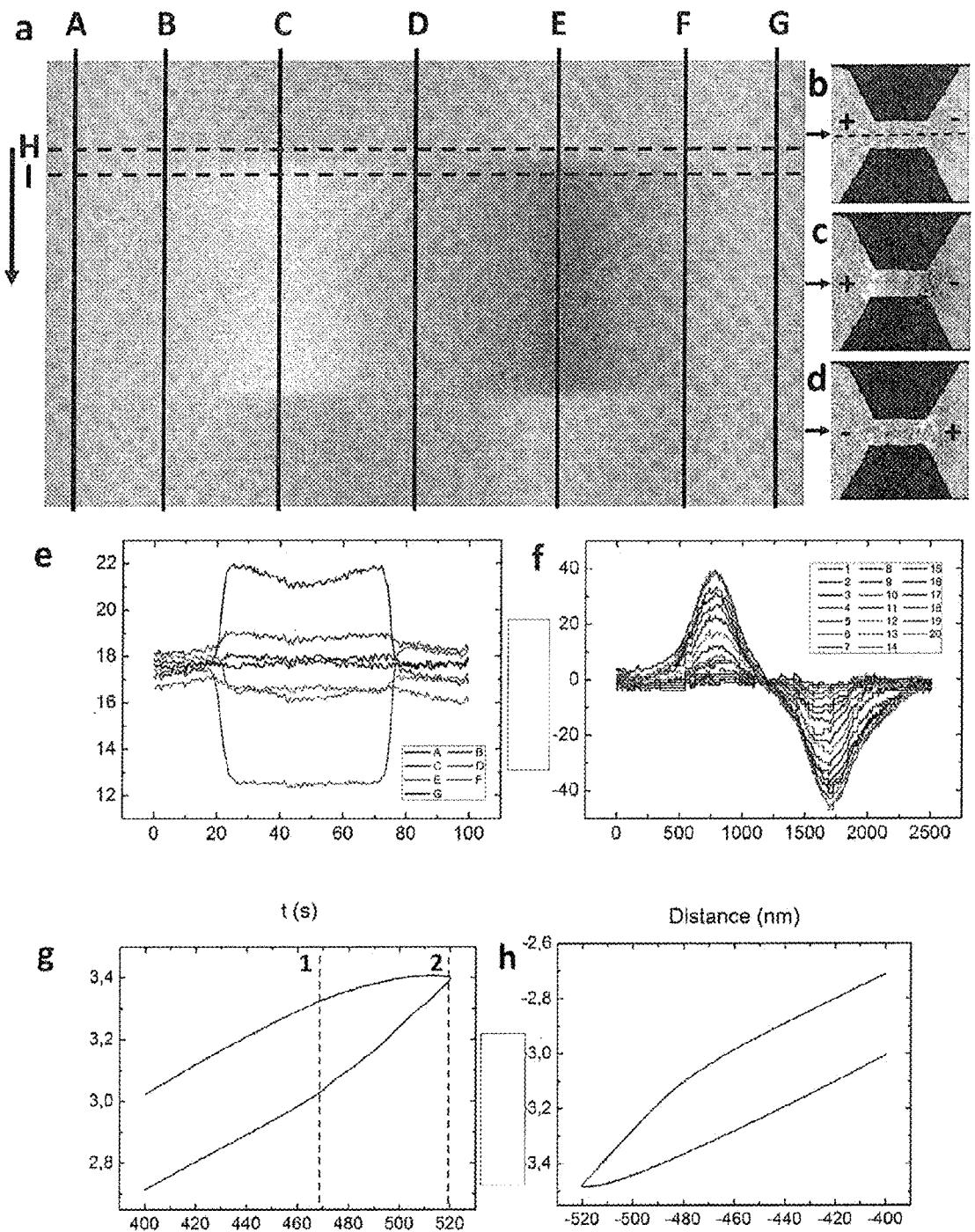
Fig. 4a-h

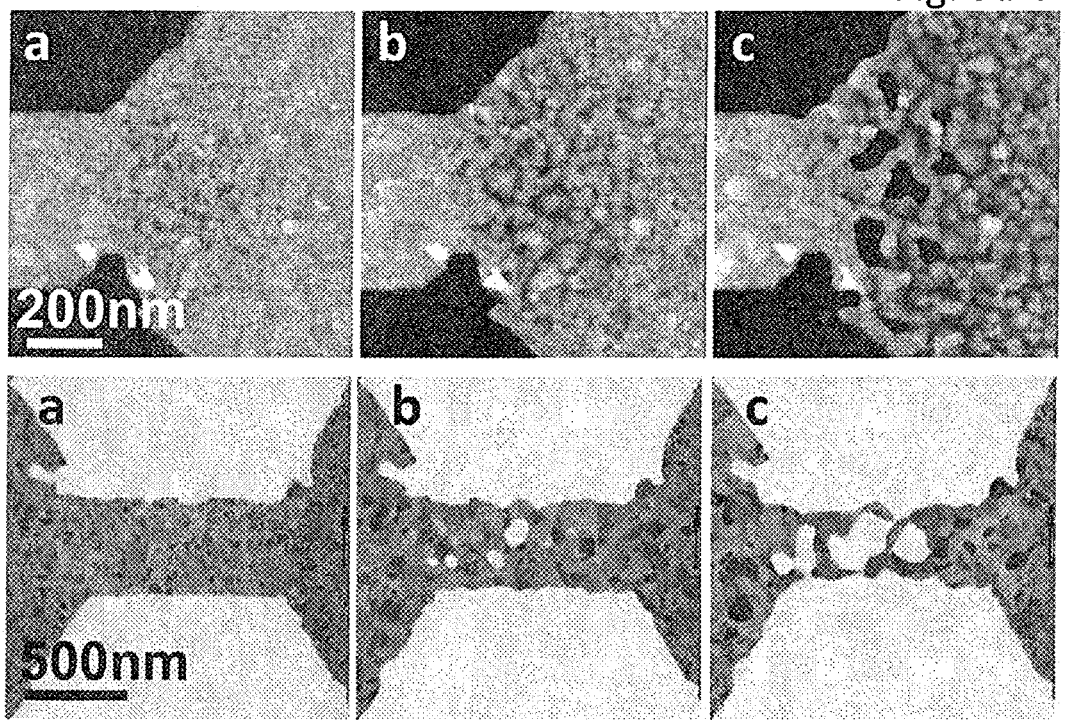
Fig. 5a-c
Fig. 6a-c
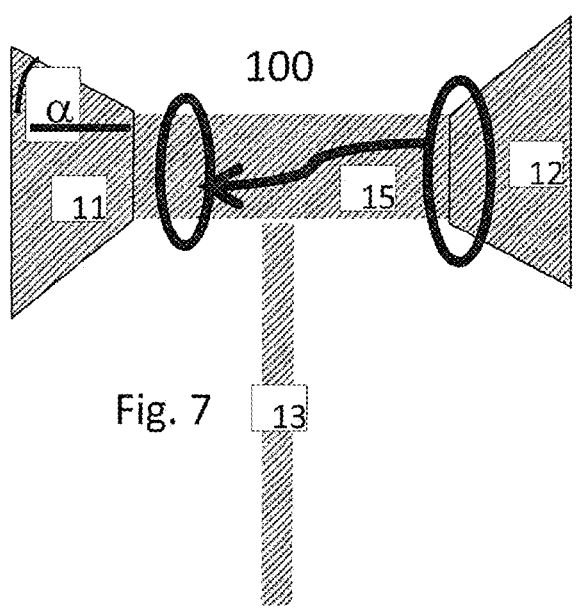
Fig. 7

MEMRISTOR WITH NANOBRIDGE STRUCTURE

CROSS-REFERENCE TO RELATED APPLICATIONS

This application claims priority to Netherlands Patent Application Serial No. 2010887, filed May 29, 2013, and the specification and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention is in the field of a nanostructures and microstructures, use thereof in a memristor, and electronic memory elements.

2. Description of Related Art

A memristor (a portmanteau of "memory resistor") was originally envisioned as a missing non-linear passive two-terminal electrical component relating electric charge and magnetic flux linkage. The above prior art memristor definition can be generalized to cover all forms of 2-terminal non-volatile memory devices based on resistance switching effects. The memristor is currently under further development.

When current flows in one direction through a memristor, the electrical resistance increases; and when current flows in the opposite direction, the resistance decreases. When a current is stopped, the memristor retains the last resistance that it had, and when the flow of charge starts again, the resistance of the circuit will be what it was when it was last active. It is believed that a prior art memristor device has a regime of operation with an approximately linear charge-resistance relationship as long as the time-integral of the current stays within certain bounds. Such provides a large area of uses.

Recently a development of a switching memristor based on a thin film of titanium dioxide took place, which relates to an on-off device. Such a device can be applied in nanoelectronic memories, computer logic, and neuromorphic computer architectures. Memristor technology can replace Flash, SSD, DRAM and SRAM memories. Typically a memristor is provided in an array, preferably built on a CMOS chip or the like, such as for applications in (neuromorphic) computer architectures.

A memristor can be characterized by experimental tests to determine if a device may properly be categorized as a memristor. In an example a memristor allows for a change in resistance that after a change therein remains constant, such that it can be used as a memory device.

It is noted that in principle many or all resistive switching memories are considered in this respect.

In a memristor an element is used having a relatively large electrical resistance, or likewise being not or at the most partly conducting. For that purpose insulators and possible semi-conductors are considered, such as the above titanium oxide. For contacting electrodes having conducting properties, such as metals, are used typically.

As a consequence existing memristors have various drawbacks. For instance functionality has yet to be demonstrated in operation at state of the art practical speeds, frequencies and densities. Further reproducibility may be an issue, as well as durability.

Electromigration is a process in which a metallic contact line is thinned by passing a current through it, thus gradually displacing atoms and ultimately leading to its destruction. In an atomistic approach, the electromigration process is the displacement of atoms from their crystal lattice position, hence requiring atoms to overcome the crystal lattice energy barrier. In this context it is important to point out that phonon scattering increases with increasing current, which in turn leads to an increase in the sample temperature (Joule heating). Thus part of the energy barrier is overcome by the temperature increase. An electromigration force is assumed to be a sum of two terms: an electrostatic force and a wind force. The electrostatic force is the direct force on an atom or ion in a material within an electric field. The wind force corresponds to the momentum transfer from the current carriers (electrons (electron-wind force) or holes (hole-wind force)) to atoms in scattering processes, such as grain-boundary scattering, surface scattering or phonon scattering.

In a continuum approximation, the damage created by electromigration can be described in terms of a combination of thermal and mechanical stresses, whereby the collapse will occur at the location of maximal thermomechanical stress. The thermal stress herein is due to the Joule heating of the sample during current passage. The mechanical stress herein arises from a change in the mass distribution due to electromigration-induced mass transport. Typically electromigration leads over time to destruction of an element, such as a contact line. Also electromigration typically is not reversible; an element is thinned at one end thereof.

Electromigration in pure metals such as copper has been investigated, but primary to study degradation of the metals.

The present invention relates to a nanobridge or microbridge and various aspects thereof which can be used in electromigration applications which overcomes one or more of the above disadvantages, without jeopardizing functionality and advantages.

BRIEF SUMMARY OF THE INVENTION

The present invention relates in a first aspect to a nanobridge or microbridge according to claim 1, in a second aspect to a memristor comprising a nanobridge or microbridge according to claim 8 or 9, further to a series of a nanobridges or microbridges, a memory device, and use of the present nanobridge or microbridge.

Surprisingly, the present nanobridge or microbridge, made of an alloy, has a very different behavior in case of, e.g., electromigration, compared to a pure material made of a single chemical element. In an example a single chemical element may relate to either one of the pure first metal and the pure second metal, such as copper. Such is described in detail below.

An effect of the present alloy is that the present bridge does not shrink and does not break or at least much later during use time, e.g., when used in electromigration. Care has to be taken not to overload the present bridge. Also at some point during operational life a bridge becomes partly too thin to perform its function, e.g., in terms of electromigration, such as when a significant fraction of material is removed (e.g., more than 50%). In fact many loops in a repeatable, controllable, and reproducible manner can be executed, as is detailed below.

It is noted that even if "magnetic" metals, such as Fe, are used, the alloy in the present application is found to be non-magnetic. So in principle also "magnetic" elements may be used in the alloy, albeit not providing overall magnetic properties.

The present bridge may be coated with further material, such as an insulating material. An example thereof is $Si_3N_4$. Likewise an $Al_2O_3$ coating may be provided. Typically some slight change in characteristics, such as mass transport, may be expected thereby. Typically such a slight change is acceptable from a practical point of view. In order to verify application of a coating layer the present bridge, in this case a PdPt bridge, has been coated with 10 nm $Al_2O_3$. The bridge had a resistance of about 77Ω. In the bridge holes are mostly formed near the cathode side of the bridge and they are refilled after the polarity is changed. The applied voltage is about ±500 mV (±10%). The behavior is the same as without coverage layers. Such a coating makes the present bridge fully integrated into existing production processes, such as semiconductor production processes. The coating may effectively seal off an underlying structure. It is noted that the present bridge may also be provided with a void, above and/or below the bridge. The bridge could as such relate to a free hanging bridge. As such no further effects of, e.g., a coating would be introduced.

Thereby the present invention provides a solution to one or more of the above mentioned problems.

Advantages of the present description are detailed throughout the description.

DETAILED DESCRIPTION OF THE INVENTION

The present invention relates in a first aspect to a nanobridge or microbridge comprising a non-magnetic alloy of at least a first and second metal, the metals being selected from Group 8, 9, 10 and 11.

In an example of the present nanobridge or microbridge the first and second metal are selected from a group comprising noble metals, such as Pt, Pd, Au, Ag, Rh, Ir, Os and Ru, and Ni, Fe, Co, and Cu. It is preferred to use an alloy comprising at least one, preferably two, noble metals. It is noted that the present alloy may comprise more than two metals (in a general formula $A_xB_yC_z$). It is noted that it is preferred that, apart from unintentional impurities, non-metals as well as non-Group 8-11 metals are absent. As such the present preferred alloy is considered to be chemically pure, that is, comprising only the at least two metals forming the alloy. Intentional impurities may for instance relate to a small amount of an element (e.g., 0.1-2% C).

It is noted that for use in contacts of the present bridge various conducting materials are considered, such as copper. Also noble metals, often Au, are considered. Sometimes conducting alloys are mentioned for this purpose in general, merely indicating a possibility of such use. In view of costs and integration issues typically only low costs well conducting materials, such as Cu, Al, etc. are considered. In view of exposure to the environment chips and the like are typically sealed or protected likewise. As such there is no need for a material capable of withstanding environmental conditions, such as noble metals. A person skilled in the art would in practice use low costs materials, typically to be integrated and compatible with a semiconductor process, e.g. Cu, Al, Si, oxides, nitrides, etc. Even further, for use in prior art bridges non-conducting materials are considered, such as oxides.

In an example of the present nanobridge or microbridge the first metal is present in a range of 50-95 wt. %, preferably 75-90 wt. %. It is preferred to have a majority of a first metal, and to have a second and optional third and further metal being present as a minority (total of less than 50 wt. %). At present best results were obtained in terms described below when the first metal was present in a range of more than 90 wt. %, such as 95 wt. %. It has been found that in an example the first metal was relatively more present in mass transported as a result of electromigration.

In an example of the present nanobridge or microbridge the first metal has an atomic mass that is at least 25% smaller than an atomic mass of the second metal, preferably at least 40% smaller. It has been found that in a good example the atomic mass of the first metal is 40%-60% of the atomic mass of the second metal (such as in Pd=106 and Pt=195).

In an example of the present bridge an effective electronegativity (or vice versa-positivity) of the first metal is 65%-90% or 110%-150% of an electronegativity of the second metal, such as from 75%-85% or from 125%-140%. The effective electronegativities are often quite close to one and another. For instance a range of ~1.6 (e.g. Cr) to ~2.4 (e.g. Au) is identified to be applicable. In a preferred embodiment even two similar effective electronegativities are used (such as Pd~Pt~2.2).

In an example of the present nanobridge or microbridge the first metal preferably is a relatively light noble metal, such as Pd, Ag, Rh, and Ru, preferably Pd, and the second metal preferably is a relatively heavy noble metal, such as Au, Ir, Os and Pt, preferably Pt.

In an example of the present nanobridge or microbridge the nanobridge or microbridge preferably is polycrystalline, with an average grain size of 1 nm-10 μm, preferably 2 nm-1 μm, such as 5 nm-100 nm. In an example a grain size of 1%-50% of a width of a present bridge, at a thickness in the order of the grain size, provides best results, e.g. in terms of reproducibility and accuracy. It is noted that chemically pure and monocrystalline bridges may still have some imperfections at a surface thereof; these imperfections do not seem to contribute significantly to electromigration characteristics.

In an example of the present nanobridge or microbridge a grain size varies from larger at a contact, such as at an upper end of the ranges mentioned above, e.g. 30 nm, or 50% of a width of the bridge, towards smaller in a middle, such as at a lower end of the ranges mentioned above, e.g. 3 nm, or 5% of a width. It has been established that a durability and lifetime of the present bridge is significantly increased thereby, typically by 50% relative.

In an example the present nanobridge or microbridge has a thickness of 3-50 nm, such as 15 nm, a length of 500-10.000 nm, such as 1000 nm, and a width of 200-1000 nm, such as 500 nm. With present lithographic tools and/or e-beam tools smaller dimensions can be obtained easily, such as below a length of about 100 nm and below a width of about 20 nm. In the example, including contacts and open area, a density of about $20*10^9$ bridges/cm$^2$ is obtained. Under laboratory conditions even smaller devices may be obtained. In near future also under practical processing and production circumstances much smaller device will be obtainable (3 by 3 nm$^2$ devices have already been reported).

Over the present length displacement of matter may take place. It has been found that for practical purpose such a displacement length (or distance) is typically in the order of 1 μm, or smaller. Such a displacement length may be influenced by applying a temperature profile. It is preferred to optimize the shape of the present bridge in view of displacement length.

In an example the present nanobridge or microbridge further comprises at least one contact pad, the contact pad having a tapered geometry with a taper angle α (between width of nanobridge and contact) of 0-60 degrees. A width of a contact pad, especially at an end thereof opposing the present bridge, may be from 1-5 times the width of the present bridge; a thickness and a length of a contact pad may be comparable to a thickness and length of the present bridge. The contact pad may also have a role in electromigration, though less important compared to the present bridge, especially if a bridge is relatively long.

In an example the present nanobridge or microbridge are (intended) for use in electromigration, especially reversible electromigration. Without further optimization the present nanobridge and microbridge can be subjected to reversible electromigration numerous times. Up to $10^5$ reversions (or loops as indicated below) have already been established. Such reversible electromigration is considered a remarkable characteristics.

In a second aspect the present invention relates to a memristor comprising a nanobridge or microbridge according to the invention. The present memristor provides amongst others an option to be used as memory by applying a voltage over the bridge or passing a current through the bridge, thereby changing the characteristics of the bridge in a controlled, reliable and reproducible manner. The change can be read out. In other words a change has been stored.

In an alternative of the second aspect the present memristor comprises one or more bridge connections. As such the memristor could be considered as a 3-terminal (or 2 plus the above one or more, i.e. 3 or more) device. If one or more bridge connections (as is visualized in FIG. 7) are provided it has been found that a resistance of a (part of the) bridge can be determined much more accurately. In fact a resistance may be determined without applying an external voltage. Also, when performing writing, during the writing a resistance can be determined actively, thereby providing an option to obtain a resistance with great accuracy and precision, reflecting a required value thereof. As such a multi bit resistance can be obtained. Even further, a local (nanometer range) resistance can be varied precisely over a, relative to a total resistance of the bridge, small range, e.g. a few percent thereof. As a result a reproducible, repeatable, and controllable "highly dynamic resistance" can be obtained, variable over various orders of magnitude, in relation to accuracy of writing and reading. In an example a resistance may vary in $10^3$ steps of 0.01Ω from 195Ω to 205Ω. It is noted that over time (during use) a resistance may change, due to the present electromigration.

The two above alternatives of the memristor may be combined into one embodiment, i.e., comprising the present bridge and comprising one or more connectors.

In a third aspect the present invention relates to a series of nanobridges or microbridges according to the invention. As such these series can be addressed at the same time, writing or reading a multi bit memory. Such may be an advantage in terms of amount of data (bits) to be written or read out per unit time. A disadvantage may be that such a series is more complicated to access and to control.

In a fourth aspect the present invention relates to an electronic device comprising a memristor according to the invention, such as a memory device, such as Flash, SSD, DRAM, SRAM, MRAM, RRAM, ReRAM, phase change memory, a transistor, a neural network, nanoelectronic memory, neuromorphic computer architecture, a switch, a chip, and combinations thereof. Also arrays and combinations of arrays of the foregoing are considered. In other words the present memristor, and likewise application of the present bridge, may be used a large variety of electronic devices. In terms of integration the present memristor and present bridge can combined with present (semiconductor) production processes without much effort.

In an example the present electronic device has a multi bit storing capacity per nanobridge or microbridge, preferably from $2^2$ bits-$2^{13}$ bits per bridge, more preferably from $2^3$ bits-$2^8$ bits per bridge. As a resistance of a part of a bridge can be read out very precisely, and as a resistance can be changed very precisely, the present bridge is very suited for multi bit storing capacity. Some care has to be taken with noise, typically present at a low level (e.g., 0.1% or less). Noise will typically limit an amount of bits per bridge to be stored. In other words a resistance of the bridge can be varied over various orders of magnitude, If a series of bridges is used the capacity can be extended likewise, typically proportional to a number of bridges used. In an example the density of bridges given above provides e.g. a memory capacity in the order of $20*10^{12}$ Byte/cm$^2$, which is $20*10^3$ GB/cm$^2$! As a result tera-byte disks become available. Further, also a read out and write velocity is much higher, also due to a multi bit read and write capability. Typical access times are in the order of ns, giving an access of at least GB/sec. Writing is somewhat slower, due to mass transport involved. Read out will be relatively quick, in the order of an access time. Future development will allow for considerable improvement of the present concept.

In a fourth aspect the present invention relates to a use of a nanobridge or microbridge according to the invention at high current density, preferably above $10^5$ A/cm$^2$, more preferably above $10^6$ A/cm$^2$, such as above $10^7$ A/cm$^2$. In an example the present bridge is used at a voltage of more than 100 mV, preferably of more than 250 mV, such as more than 500 mV. In other words the present invention provides the possibility to use a very high current density, at a relatively low voltage. Such makes the invention suited for many (electronic) applications.

The invention is further detailed by the accompanying figures and examples, which are exemplary and explanatory of nature and are not limiting the scope of the invention. To the person skilled in the art it may be clear that many variants, being obvious or not, may be conceivable falling within the scope of protection, defined by the present claims.

SUMMARY OF FIGURES

FIG. 1. (a) SEM image of a 2×2 m$^2$ chip with gold contacts and Pd—Pt bridges located in the black area in the middle (freestanding membrane). (b) Magnified view of a membrane corner, so that bridges (indicated with white arrows) and contacts are clearly visible. (c) Schematic view of Pd—Pt bridges with different geometries of the contact pads. (d) Tip of the holder used for the in situ electrical measurements with the chip mounted on top of an Al$_2$O$_3$ carrier.

FIG. 2. Snapshots from the TEM footage showing the process of reversible electromigration. (a) TEM image of the initial configuration of the bridge. (b) TEM image of the Pd—Pt bridge after some preliminary grain growth. During electromigration, voids form on the cathode side (c, e, g, h) and are subsequently refilled (d, f) due to the changing of current direction. Arrows indicate the direction of electrons. (i) Typical I-V curve for one loop in bias ramping mode.

FIG. 3. Snapshots from the STEM footage showing the direction of material transfer. (a) Initial view of the bridge.

During electromigration, voids form on the cathode side and material accumulate on the anode size (b, d-e, g-h). When the current is reversed, the voids are refilled (c, f). Arrows indicate the direction of electrons. (i) Typical I-V curve for one loop in the bias mode.

FIG. 4. (a) Thickness changing along the bridge axis as a function of time, vertical lines indicate where the intensity profiles (e) were taken. (b-d) Snapshots from the STEM footage taken during electromigration at the times indicated by the arrows. (e) Gray-value change along lines A-G indicated in (a). (f) Gray-value change along the horizontal lines taken between lines H-I indicated in (a) with a step of 1 frame. (g, h) Increased areas of I-V plot (in FIG. 3e) near the maximum and the minimum voltages, respectively.

FIG. 5. Snapshots from the STEM footage showing the grain boundaries grooving on the contact pad near the cathode side during electromigration.

FIG. 6. Snapshots from the TEM footage showing the bridge breakage process during AC passage.

FIG. 7 shows a schematic configuration of a present memristor.

DETAILED DESCRIPTION OF FIGURES

The figures are further detailed in the description of the experiments below.

Examples/Experiments

The invention although described in detailed explanatory context may be best understood in conjunction with the accompanying examples and figures.

Given that Pd and Pt are both noble materials from platinum-group metals and have quite different masses, inventors studied the electromigration behavior of a Pd—Pt alloy.

In this paper inventors report in situ transmission electron microscopy (TEM) and scanning TEM (STEM) results for electromigration in Pd—Pt (10 wt. % Pt) nanobridges with different geometries. An in situ TEM study of electromigration processes in thin polycrystalline bridges allows the changes caused by the electromigration process to be imaged down to the atomic scale. Inventors focused in particular on the direction of material migration in relation to the electric current direction and show that material transfer occurs from the cathode towards the anode side and that transport is reversible by changing the current direction, in a reproducible and controllable manner, which is considered remarkable.

The electromigration process in nanobridges was investigated by in situ TEM using a FEI Titan microscope operating at 300 keV. A custom electromigration holder, built in-house, has eight contacts for performing electrical measurements and can be cooled to about 100 K. The combination of these tools with the electrical setup ("IVVI rack") allows footage of the morphology transformations to be recorded in real time at the nanoscale, as well as I-V curves during passage of an electric current.

Polycrystalline Pd—Pt nanobridges with a thickness of 15 nm were produced by e-beam evaporation from a Pd—Pt alloy source onto a 100-nm-thick freestanding silicon nitride membrane. Details of the membrane preparation are given in Ref. Gao, B., et al., "Three-terminal electric transport measurements on gold nano-particles combined with ex situ TEM inspection." Nanotechnology, 2009. 20(41). The contacts towards the nanobridges were made with a 100-nm-thick layer of gold and a 3-nm-thick adhesion layer of Cr. Patterns for Pd—Pt bridges and gold contacts were written using 2-step e-beam lithography. A scanning electron microscopy (SEM) image of the chip is shown in FIGS. 1a and b. The 2×2 mm$^2$ chip has 28 gold contacts (white lines in FIG. 1a), which allow connection of the Pd—Pt bridges to electrical contacts of the electromigration holder. The bridges had different lengths (500-1000 nm) and widths (200-500 nm). FIG. 1c shows a schematic image of bridges with various geometries of contact pads, which are also made of Pd—Pt. The total resistance of the structures—including the resistance of bridges, contact pads and leads—before applying an electric current was between 100 and 200 Ohm.

The chip with the Pd—Pt nanobridges was fixed onto an Al$_2$O$_3$ chip carrier using conductive tape, such that the chip was electrically connected to one of the metallic contact lines on the chip carrier. Gold contact pads of several bridges were then connected with the chip carrier by means of the standard wire bonding technique. For in situ electrical measurements, the chip with the Al$_2$O$_3$ chip carrier was placed into the TEM holder, the tip of which is shown in FIG. 1d. The experiments were conducted in bias-ramping mode, i.e. a uniform increase in voltage from 0 V to a maximum of 350-600 mV (this was chosen in each separate experiment), followed by a decrease back to 0 V, a subsequent increase into a negative range (−350 to −600 mV), followed by a decrease back to the original starting point of 0 V. In the application this is called a "loop". If the bridge did not break after one loop, further loops were applied with an increase in the maximum voltage until the bridge broke. Throughout these cycles the rate of the voltage ramp is set to 8-15 mV/s. Part of the holder was cooled with liquid nitrogen, thus all experiments were performed at −173° C. (~100° K) at the holder tip, which was done to prevent beam-induced carbon contamination on the sample. Note that, due to Joule heating, the measured bridge is warmer. Inventors recorded the footage of in situ electromigration experiments in TEM mode directly from the computer screen with a frame rate of 10-15 fps. TEM Imaging & Analysis (TIA) software was used to record STEM footage with a frame rate of 3 fps.

FIG. 2 shows snapshots of the real-time TEM footage recorded during the passage of electric current through a Pd—Pt bridge (200 nm wide and 1000 nm long). The as-fabricated Pd—Pt bridge is found to be polycrystalline with an average grain size of 10 nm (FIG. 2a). In FIG. 2b bigger grains are visible in the bridge; those grains were formed during the preceding current annealing when the applied voltage was increased to 400 mV. The rest of the TEM images in FIG. 2 correspond to three voltage loops: the maximum voltage in the first loop (c-d) was 450 mV, in the second one (e-f) it was 470 mV, and in the third one (g-h) it was 500 mV. When the voltage was increased in the third loop to 500 mV, the bridge broke near the cathode side. The current density at the moment when electromigration starts according to visual inspection with the TEM was $3\times10^7$ A/cm$^2$. A typical I-V curve of the loop is shown in FIG. 2i. Arrows in the images correspond to the direction of electrons from the cathode (−) to the anode (+). The electromigration results shown in FIG. 2 are similar for all bridges, including those with other geometries (variations in lengths, widths and angels between bridges and contacts were explained earlier in this application).

FIG. 3 shows snapshots of the STEM footage, taken during in situ electrical measurements. Similar to FIG. 2, the images in FIG. 3 correspond to three loops of voltage increase (a: initial view of the bridge, b-c: first loop, d-f: second loop, g-h: first part of the third loop till the bridge breaks) in the bias-ramping regime. The maximum voltages were 500 mV (b-c), 520 mV (d-f) and 540 mV (g-h), respectively. Electromigration started with a current density of $3\times10^7$ A/cm$^2$. The bridge shown has a length of 1000 nm and a width of 500 nm. The STEM images were obtained with a medium camera length (117 mm) in order to record images of a good quality with minimized value of the diffraction contrast, and thus to allow to interpret a contrast change as due to a change in thickness. The frame rate of the STEM footage was selected at 3 fps to achieve an acceptable image quality for the selected camera length. As can be seen in FIGS. 3a and b, increasing the voltage to 500 mV causes voids to form at the cathode side (darker areas). At the same time the sample thickens and hillocks form (lighter areas) at the anode side. Changing the current direction caused the voids to refill and even hillocks to grow on the formerly cathode side (which is now the anode side). In summary, repeating the voltage loops leads to reverse material transport from the cathode to the anode side. Inventors conducted experiments on bridges with different geometries, and observed the process of reversible electromigration in every case.

To analyze in detail the material transfer as a function of time, data from the STEM footage was processed using ImageJ software. FIG. 4a shows the contrast change along the bridge axis, which corresponds to changes in thickness as a function of time. It is considered as a representation of the raw footage (the original duration of the footage was 100 s) recorded for one voltage loop with a maximum voltage of 520 mV for the sample presented in FIG. 3. Inventors applied a Gaussian blur with a radius of 20 pixels (115 nm) to each frame of the footage. The Gaussian blur was applied to reduce the effect of diffraction contrast; thus the contrast variation truly represents the thickness variation along the bridge. Afterwards, inventors extracted central lines from each frame (the dashed line shown in FIG. 4b) and put them all together in one image (FIG. 4a) where every horizontal line in FIG. 4a corresponds to a line in corresponding frame of the footage. The upper part of FIG. 4a corresponds to the initial state of the bridge prior to electromigration and shows the uniformity of the bridge thickness. One of the first STEM snapshots from this area is presented in FIG. 4b. The middle part of FIG. 4a represents the electromigrated state of the bridge with mass transferred from the cathode (right side) to the anode (left side). The corresponding image is shown in FIG. 4c. The bottom area in FIG. 4a corresponds to the situation after reversed current flow, where transport of the material toward the right (anode) side is observed as the voids are completely refilled and even a small hillock forms (see FIG. 4d).

The vertical black lines in FIG. 4a indicate where the intensity profiles shown in FIG. 4e were taken (x-axis time in seconds, y-axis grey value). Lines C and E correspond to the ends of the Pd—Pt bridge. The distance between them is 1000 nm, which is equal to the bridge length. Lines C and E in FIG. 4e have large plateaus in the middle parts with maximum and minimum intensity levels as a result of material addition and depletion, respectively. FIG. 4f shows the gray-value change along the horizontal lines taken between lines H and I in FIG. 4a with a step of one pixel corresponding to one third of second (x-axis distance in nm, y-axis grey value). These data show the change in contrast compared to line H obtained by subtraction. Before the material transfer (close to line H in FIG. 4a), the intensity is uniform along the entire bridge, but afterwards (close to line I in FIG. 4a) light and dark areas appear, which indicate regions of material addition and depletion, respectively. The total period of material transfer takes approximately 18 frames; so with a frame rate of 3 fps, the duration is approximately 6 s, corresponding to a change of 90 mV, inventors can obtain the same 90 mV change from the I-V curve in FIG. 4g (x-axis voltage in mV, y-axis current in mA). Line 1 corresponds to the voltage at the beginning and the end of material transfer and line 2 indicates the maximum voltage in the cycle. The difference in voltages between lines 1 and 2 is approximately 45 mV, which should be multiplied by a factor of 2 to obtain the total transition voltage. The process of void and hillock formation and refilling seems to start quite abruptly, since there are sharp contrast changes in profiles C and E observed. These abrupt starts of the material transfer are believed to point to the existence of a threshold value for electromigration. When this threshold value with a current density of approximately $3 \times 10^7$ A/cm$^2$ is exceeded, electromigration starts and evolves rapidly. For pure Pd micro-stripes, which have lengths of 100-1000 µm, widths of 2.2-3.5 µm and thicknesses of 40-80 nm, it is reported that these are stable when the current density reaches 80-90% of the failure current density (0.8 to $1 \times 10^7$ A/cm$^2$), which phenomenon is in a good agreement with present results for Pd—Pt bridges. Lines A and G in FIGS. 4a and 4e indicate places that are not affected by electromigration, because of their lower current density and lower temperature due to the contact pads acting as heat sinks. Lines B and F represent places in the contact pads where some material transport still occurs. FIG. 4h (x-axis voltage in mV, y-axis current in mA) relates likewise to FIG. 4g to a negative voltages applied. In summary, mass transfer occurred within a Pd—Pt bridge and in close proximity to it (between lines B and F in FIG. 4a). Line D, corresponding to the middle of the bridge, shows that in this part of the bridge there is almost no change in thickness. This is also visible in FIG. 4f, where all lines have a crossover in the middle part of the bridge. Changes in thickness do occur in the rest of the bridge as is most clearly seen in FIG. 4f. In case of a reduction in thickness inventors do not see any grain boundary grooving in most of the bridge area (see also next paragraph).

FIG. 5 shows STEM images of one of the contact pads during electromigration. Therefrom it is evident that changes during electromigration mostly occur at the grain boundaries. Material transport starts with grooving of the grain boundaries from the surface, followed by further depletion down to the substrate and a subsequent widening. Note that some of the grain boundaries are not grooved; inventors suggest that these are low-energy grain boundaries, and that the fastest grooving grain boundaries have a high energy. If the current is reversed, the grooves at the grain boundaries are refilled and the initial configuration is almost resumed. Although there is grain boundary grooving at the contact pad next to the "entrance" of the bridge, there is no grooving on the bridge itself. In this area, in addition to out-diffusion in the direction of the electron flow, there is in-diffusion from the atoms arriving from the contact pad, whereby the last flux is strong enough to prevent grooving. This is in agreement with the refilling of the grooves with reversible electromigration.

In order to further investigate the effect of Joule heating on the nanobridge morphology, inventors apply an alternating current (AC) of different frequencies (2-100 Hz) to several bridges. When AC is applied to the bridge, the electromigration force periodically changes its direction, so the changes are primarily due to the temperature. A typical example of bridge breakage is presented in FIG. 6. In FIG. 6a one can see large grains formed due to Joule heating; then, in FIG. 6b, voids start to expand from the middle of the bridge, and finally the bridge breaks in the middle, as shown in FIG. 6c. As the bridges broke at the center in all cases where AC was applied, inventors conclude that the temperature is highest in this area.

Inventors believe that, in general, material depletion can be caused by electromigration or by out-diffusion owing to a temperature gradient, which allows a certain amount of material to migrate toward the colder regions (contact pads).

Present experiments have produced no evidence of material transport from the area of depletion on the cathode side against the direction of the electron flow. Inventors therefore conclude that all material transport in present experiments was driven by the electromigration force (the sum of direct and the electron wind forces).

The in situ TEM experiments have shown clearly and consistently that electromigration with a DC current in Pd—Pt nanobridges removes material from the cathode side of the nanobridge and from the neighboring contact. The electromigrated atoms are deposited mainly at the end of the bridge and on the neighboring contact pad, where hillocks are formed. If the current is reversed, the opposite occurs: material is removed from the hillock area and previously depleted areas are filled with material again. Material transport during electromigration can be imaged best with in-situ STEM. The critical current density for bridge breakage is at present 3-5× $10^7$ A/cm$^2$. inventors investigated many bridges with different geometries, and the same effect of reversible electromigration is consistently observed. Continuation of this process with loops in which the maximum voltage is gradually increased ultimately breaks the bridge at the cathode side.

It is noted that the behavior of the present Pd—Pt alloy is quite different from the pure elements Pt and Pd. It is noted that the electromigration of Pt and Pd is very similar: after a recrystallization (which resembles that of the Pd—Pt alloy) the bridge becomes gradually narrower and finally a nanogap is formed, whereby grain boundary grooving is not a dominant feature. For the Pd—Pt alloy it is found that the dominant change is grain boundary grooving, while the outer shape of the nanobridge is maintained.

A controllable resistance change is a basic principle of a memristor. If inventors restrict the maximum voltage to a value high enough for material transfer but not enough for bridge breakage, this depletion and refilling of material can be repeated many times. For instance, inventors have tried 15 cycles all with quite strong material transfer observed by STEM imaging and only observed a small change after the full 15 cycles. Note that these experiments are quite crude, since inventors use visual inspection to see a major change. This can be made much more controlled such that the sustainability is much higher.

FIG. 7 shows a configuration of a present memristor. Therein contacts 11,12 are shown, having a nanobridge 15 therein between. In the figure an area at the right side is indicated. From this area material is moved by electromigration, indicated by the arrow, to an area at the left side, also indicated by an ellipsoid. As a result the resistance of the bridge increase between contact 12 and connection 13 and the resistance decreases between contact 11 and connection 13. The contacts 11,12 have a tapered shape, with an angle α, taken as an angle between a line parallel to the bridge and in the example un upper side of the left contact 11.

Further one or more connections 13 are provided, for accurately measuring a resistance, either at a portion of the bridge at a left side thereof, or likewise at a right side thereof, or both.

It should be appreciated that for commercial application it may be preferable to use one or more variations of the present system, which would similar be to the ones disclosed in the present application and are within the spirit of the invention.

What is claimed is:

1. A nanobridge comprising a non-magnetic alloy of at least a first and second metal, the metals being selected from Group 8, 9, 10 and 11, wherein the first metal is present in a range of 50-95 wt. %, and the second metal is present in a range of 5-25 wt. %, wherein the nanobridge is polycrystalline, with an average grain size of 1 nm-10 μm, with a grain size varying from larger at a contact towards smaller in the middle, or vice versa.

2. The nanobridge according to claim 1, wherein the first and second metals are selected from the group consisting of the noble metals, Pt, Pd, Au, Ag, Rh, Ir, Os and Ru, and Ni, Fe, Co, and Cu.

3. The nanobridge according to claim 1, wherein the first metal is present in a range of 75-90 wt. %.

4. The nanobridge according to claim 1, wherein the first metal has an atomic mass that is at least 25% smaller than an atomic mass of the second metal, and/or wherein an effective electronegativity of the first metal is 65%-90% or 110%-150% of an electronegativity of the second metal.

5. The nanobridge according to claim 1, wherein the first metal is Pd and the second metal is Pt.

6. The nanobridge according to claim 1, having a thickness of 3-50 nm, a length of 500-10.000 nm, and a width of 200-1000 nm.

7. The nanobridge according to claim 1, further comprising at least one contact pad, the contact pad having a tapered geometry with a taper angle α between width of nanobridge and contact of 0-60 degrees.

8. The nanobridge according to claim 1, for use in electromigration and/or reversible electromigration.

9. A memristor comprising a nanobridge according to claim 1.

10. A memristor according to claim 9 comprising one or more bridge connections.

11. A series of nanobridges according to claim 1.

12. An electronic device comprising a memristor according to claim 9.

13. An electronic device according to claim 12, having a multi bit storing capacity per nanobridge.

14. A method of using a nanobridge according to claim 1 comprising the steps of applying a high current density above $10^5$ A/cm$^2$ and applying a voltage of more than 100 mV to the nanobridge.

15. The electronic device according to claim 12, wherein said device is selected from the group consisting of a memory device, Flash device, SSD, DRAM, SRAM, MRAM, RRAM, ReRAM, phase change memory, a transistor, a neural network, a nanoelectronic memory, a neuromorphic computer architecture, a switch, a chip, and combinations thereof.

16. The electronic device according to claim 12, comprising at least one array.

17. The electronic device according to claim 13, wherein the capacity is from $2^2$ bits-$2^{16}$ bits per bridge.

\* \* \* \* \*